(12) United States Patent
Han et al.

(10) Patent No.: US 11,339,475 B2
(45) Date of Patent: May 24, 2022

(54) FILM STACK OVERLAY IMPROVEMENT

(71) Applicant: Applied Materials, Inc., Santa Clara, CA (US)

(72) Inventors: Xinhai Han, Santa Clara, CA (US); Deenesh Padhi, Sunnyvale, CA (US); Daemian Raj Benjamin Raj, Fremont, CA (US); Kristopher Enslow, San Jose, CA (US); Wenjiao Wang, San Jose, CA (US); Masaki Ogata, San Jose, CA (US); Sai Susmita Addepalli, San Jose, CA (US); Nikhil Sudhindrarao Jorapur, Sunnyvale, CA (US); Gregory Eugene Chichkanoff, Mountain View, CA (US); Shailendra Srivastava, Fremont, CA (US); Jonghoon Baek, San Jose, CA (US); Zakaria Ibrahimi, Santa Clara, CA (US); Juan Carlos Rocha-Alvarez, San Carlos, CA (US); Tza-Jing Gung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 209 days.

(21) Appl. No.: 16/678,996

(22) Filed: Nov. 8, 2019

(65) Prior Publication Data
US 2020/0173022 A1 Jun. 4, 2020

Related U.S. Application Data

(60) Provisional application No. 62/773,522, filed on Nov. 30, 2018.

(51) Int. Cl.
*C23C 16/505* (2006.01)
*C23C 16/455* (2006.01)
(Continued)

(52) U.S. Cl.
CPC ...... *C23C 16/45565* (2013.01); *C23C 16/345* (2013.01); *C23C 16/401* (2013.01);
(Continued)

(58) Field of Classification Search
CPC ............ C23C 16/45565; C23C 16/345; C23C 16/401; C23C 16/505
See application file for complete search history.

(56) References Cited

U.S. PATENT DOCUMENTS

| 6,444,084 B1 * | 9/2002 | Collins | H01J 37/321 118/723 I |
| 2003/0089314 A1 * | 5/2003 | Matsuki | H01J 37/32009 118/715 |

(Continued)

FOREIGN PATENT DOCUMENTS

| WO | WO 2016/060753 A1 * | 4/2016 | H01L 21/31 |
| WO | 2018199507 A1 | 11/2018 | |

OTHER PUBLICATIONS

Li, Tao, et al., "Plasma treatment effect on gate stack electrical properties". Nanotech (2018) 1-5. 10.1109/NANOTECH.2018. 8653559.*

(Continued)

*Primary Examiner* — Bret P Chen
(74) *Attorney, Agent, or Firm* — Patterson + Sheridan, LLP

(57) ABSTRACT

An apparatus and a method for depositing a film layer that may have minimum contribution to overlay error after a sequence of deposition and lithographic exposure processes are provided. In one example, a method includes positioning a substrate on a substrate support in a process chamber, and flowing a deposition gas mixture comprising a silicon containing gas and a reacting gas to the process chamber through a showerhead having a convex surface facing the substrate support or a concave surface facing the substrate (Continued)

support in accordance with a stress profile of the substrate. A plasma is formed in the presence of the deposition gas mixture in the process chamber by applying an RF power to multiple coupling points of the showerhead that are symmetrically arranged about a center point of the showerhead. A deposition process is then performed on the substrate.

17 Claims, 7 Drawing Sheets

(51) Int. Cl.
  *H01L 27/11524*  (2017.01)
  *H01L 27/1157*  (2017.01)
  *H01L 27/11578*  (2017.01)
  *H01L 27/11551*  (2017.01)
  *C23C 16/34*  (2006.01)
  *H01J 37/32*  (2006.01)
  *C23C 16/40*  (2006.01)

(52) U.S. Cl.
  CPC .. *H01J 37/32174* (2013.01); *H01J 37/32449* (2013.01); *H01J 37/32568* (2013.01); *H01L 27/1157* (2013.01); *H01L 27/11524* (2013.01); *H01L 27/11551* (2013.01); *H01L 27/11578* (2013.01); *H01J 2237/3321* (2013.01)

(56) References Cited

U.S. PATENT DOCUMENTS

| | | | | |
|---|---|---|---|---|
| 2010/0304527 | A1* | 12/2010 | Borden | H01L 21/67196 438/87 |
| 2011/0240114 | A1* | 10/2011 | Stewart | H01L 31/068 136/256 |
| 2014/0087489 | A1* | 3/2014 | Rocha-Alvarez | H01J 37/32183 438/5 |
| 2015/0170925 | A1 | 6/2015 | Chen et al. | |
| 2016/0086818 | A1 | 3/2016 | Hamano et al. | |
| 2016/0203971 | A1 | 7/2016 | Tsiang et al. | |
| 2016/0307752 | A1 | 10/2016 | Kulshreshtha et al. | |
| 2017/0081763 | A1 | 3/2017 | Finer et al. | |
| 2017/0338140 | A1* | 11/2017 | Pape | H01J 37/32082 |

OTHER PUBLICATIONS

Shramkova, Oksana, et al., "Nonlinear wave scattering by stacked layers of semiconductor plasma". Eur. Phys. J. D 68, 43 (2014) pp. 1-9. https://doi.org/10.1140/epjd/e2014-40483-2.*

Hoogeland, D., et al., "Plasma-assisted atomic layer deposition of TiN/Al2O3 stacks for metal-oxide-semiconductor capacitor applications". Journal of Applied Physics 106, 114107 (2009), pp. 1-7. https://doi.org/10.1063/1.3267299.*

Wang, C.X., et al., "Penetration depth of atmospheric pressure plasma surface modification into multiple layers of polyester fabrics". Surface & Coatings Technology 202 (2007) 77-83.*

Xu, Lin, et al., "Diagnostics of ballistic electrons in a dc/rf hybrid capacitively coupled discharge". Applied Physics Letters 93, 261502 (2008), pp. 1-3.*

Okumura, Tomohiro, "Inductively Coupled Plasma Sources and Applications". Physics Research International, vol. 2010, Article ID 164249, pp. 1-14.*

Ren, Hongwen, et al., "A new method for fabricating high density and large aperture ratio liquid microlens array". Optics Express, vol. 17, No. 26, Dec. 21, 2009, 24183-24188.*

International Search Report and Written Opinion dated Apr. 29, 2020 for Application No. PCT/US2019/060610.

* cited by examiner

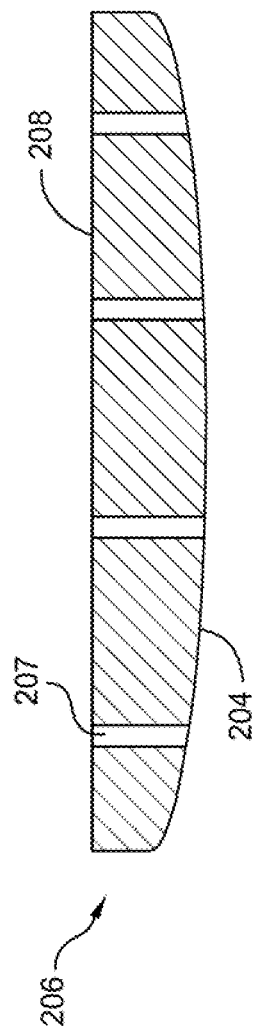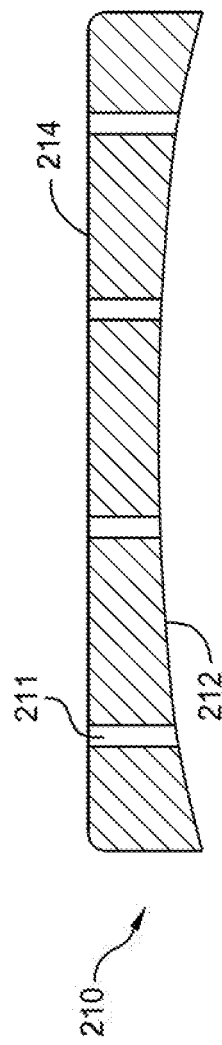

FILM STACK OVERLAY IMPROVEMENT

CROSS-REFERENCE TO RELATED APPLICATIONS

This application claims benefit of U.S. provisional patent application Ser. No. 62/773,522, filed Nov. 30, 2018, which is herein incorporated by reference.

BACKGROUND

Field

Embodiments of the present disclosure generally relate to a process chamber and a method for reduction of film stack overlay issues introduced by film stress non-uniformity during processing of a substrate.

Description of the Related Art

A long-recognized challenge in producing vertically integrated devices is reducing distortion of the substrate and layer stack introduced during the manufacturing process. Various film stresses may be created between one layer and the next layer due to differences in thermal expansion, plasma non-uniformity distribution, and/or plasma density during plasma etching or plasma deposition processes, which results in the localized deformation of the substrate surface and undesirable overlay error. When overlay errors occur, the size, dimension or structures of device dies formed on the substrate may be irregularly deformed or distorted, thus increasing likelihood of misalignment between the film layers stacked thereon, which may adversely increase the probability of misalignment in the subsequent manufacturing process.

SUMMARY

In one embodiment, a method for forming a film layer on a substrate is provided. The method includes positioning a substrate on a substrate support in a process chamber, flowing a deposition gas mixture comprising a silicon containing gas and a reacting gas to the process chamber through a showerhead having a convex surface facing the substrate support or a concave surface facing the substrate support in accordance with a stress profile of the substrate, forming a plasma in the presence of the deposition gas mixture in the process chamber by applying an RF power to multiple coupling points of the showerhead that are symmetrically arranged about a center point of the showerhead, and performing a deposition process while rotating the substrate to deposit a film layer on the substrate.

In another embodiment, the method includes positioning a substrate on a substrate support in a process chamber, the substrate support having a concave substrate supporting surface or a convex substrate supporting surface in accordance with a stress profile of the substrate, flowing a deposition gas mixture comprising a silicon containing gas and a reacting gas to a process chamber through a showerhead, forming a plasma in the presence of the deposition gas mixture in the process chamber by applying an RF power to multiple coupling points of the showerhead that are symmetrically arranged about a center point of the showerhead, and performing a deposition process while rotating the substrate to deposit a film layer on the substrate.

In another embodiment, the method includes positioning a substrate on a substrate support in a process chamber, the substrate support having a concave substrate supporting surface or a convex substrate supporting surface in accordance with a stress profile of the substrate, flowing a deposition gas mixture comprising a silicon containing gas and a reacting gas to a process chamber through a showerhead having a convex surface facing the substrate support or a concave surface facing the substrate support in accordance with a stress profile of the substrate, forming a plasma in the presence of the deposition gas mixture in the process chamber by applying an RF power to multiple coupling points of the showerhead that are symmetrically arranged about a center point of the showerhead, and performing a deposition process while rotating the substrate to deposit a film layer on the substrate and tuning side-to-side or front-to-back plasma density over the substrate by adjusting a height of the substrate support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIGS. 2A-2B are schematic cross-sectional views of a showerhead according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure describe an apparatus and a method for depositing a film layer that may have minimum contribution to overlay error after a sequence of deposition and lithographic exposure processes. In one embodiment, the deposition method may form a film layer with minimum stress variation or in-plane distortion (IPD) across the film layer surface so as to provide consistent film stress in each film layer formed on the substrate. Therefore, the overlay error can be minimized or eliminated when integrating all film layers from a sequence of deposition and lithographic exposure processes to form semiconductor devices.

Figure 1:
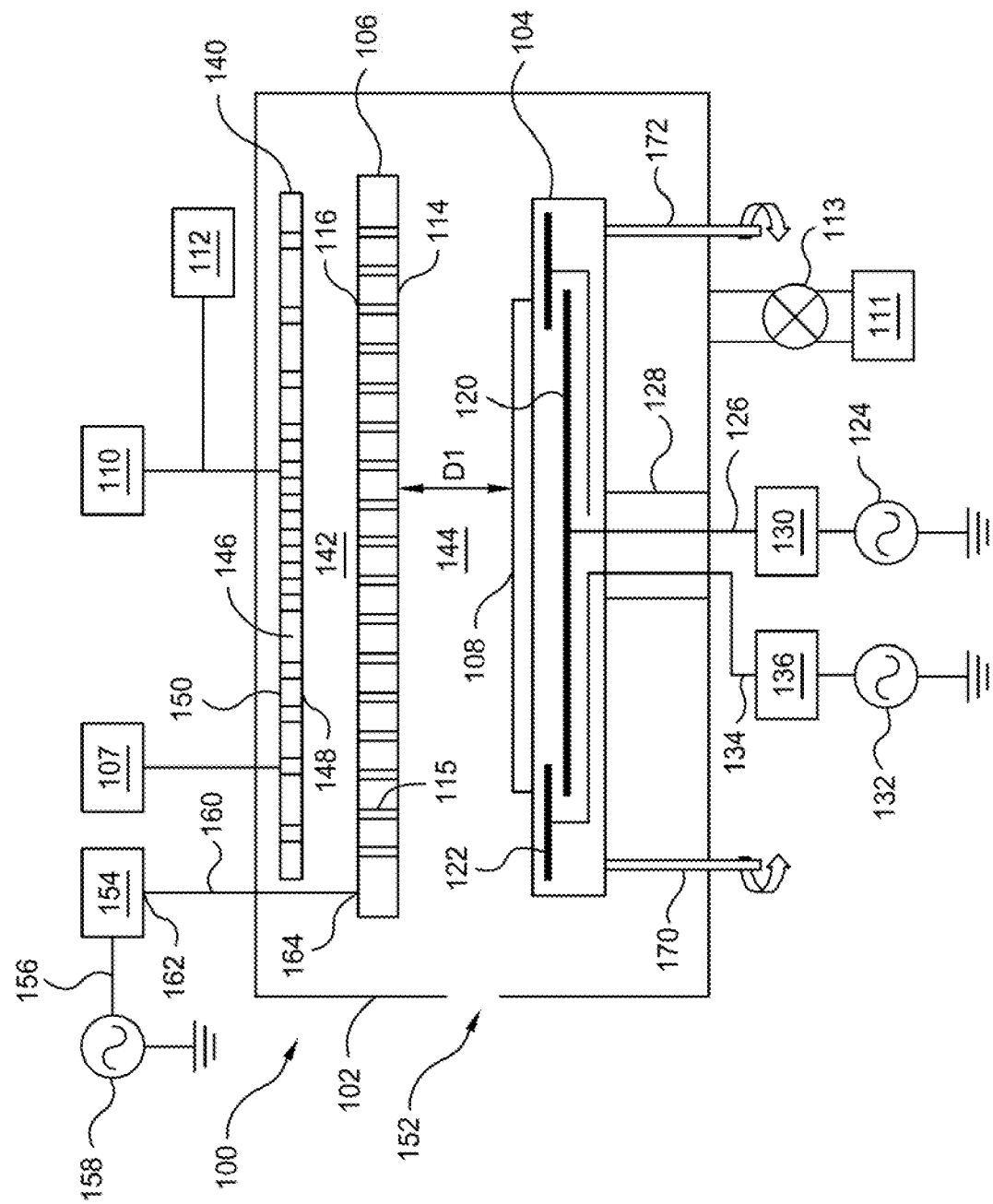
FIG. 1 is a schematic cross-sectional view of a process chamber according to one or more embodiments.

FIG. 1 is a schematic cross-sectional view of a process chamber 100 according to one or more embodiments. The process chamber 100 may be a plasma enhanced chemical vapor deposition (PECVD) chamber that is utilized to deposit dielectric film stacks, such as a stack with alternating oxide and nitride layers or a stack with alternating oxide and polycrystalline silicon layers. As shown in FIG. 1, the process chamber 100 includes a chamber wall 102, a substrate support 104 disposed within the chamber wall 102, and a showerhead (e.g., gas distribution plate) 106 disposed within the chamber wall 102. The substrate support 104 is disposed below the showerhead 106 and configured to support a substrate 108. The substrate 108 can be a dummy wafer or a production wafer. A slit valve opening 152 may be formed in the chamber wall for loading and unloading one or more substrates, such as the substrate 108. A vacuum pump 111 is coupled to a bottom of the process chamber 100 to evacuate the process chamber 100. A valve 113 may be selectively opened and closed to control the degree of vacuum within the vacuum pump 111.

During operation, the substrate support 104 may be rotating in order to rotate the substrate 108 disposed thereon. The rotation of the substrate support 104 may be a continuous rotation in one direction (either in clockwise or counter-clockwise), or oscillating in opposite directions, such as changing rotation direction after rotating 180 degrees. The rotation of the substrate support 104 can improve thickness uniformity of the deposited film stack. In some embodiments, the substrate support 104 may be heated to an elevated temperature, such as up to 700 degrees Celsius, for high temperature processes.

An RF power source 107 is coupled to a blocking plate 140, which is disposed above the showerhead 106. The blocking plate 140 and the showerhead 106 together define a gas mixing volume 142 (between the blocking plate 140 and the showerhead 106) and a reaction volume 144 (between the blocking plate 140 and the substrate support 104) for the process chamber 100. A plurality of apertures 146 are formed through the blocking plate 140.

The showerhead 106 includes a first surface 114 facing the substrate support 104 and a second surface 116 opposite the first surface 114. A plurality of gas passages 115 are formed in the showerhead 106 that extend from the first surface 114 to the second surface 116. The showerhead 106 is sized to cover the substrate support 104. The showerhead 106 is typically fabricated from stainless steel, aluminum (Al), anodized aluminum, nickel (Ni) or other RF conductive material. The showerhead 106 may be cast, brazed, forged, hot iso-statically pressed or sintered. The showerhead 106 may be circular or polygonal, such as rectangular or square.

A gas source 110 may be coupled to the blocking plate 140 for delivering one or more process gases into the process chamber 100. A remote plasma source 112 may be also coupled to the showerhead 106 for delivering a cleaning agent, such as dissociated fluorine, into the process chamber 300 to remove deposition by-products and films from process chamber hardware, such as the showerhead 106.

Various approaches can be utilized in the process chamber 100 to minimize or eliminate process-induced in-plane distortion (IPD) of a film stack on a substrate. IPD includes radial distortion and/or planar distortion. Radial distortions as used herein refer to distortion between points along a given radius of a substrate, which may be determined by calculating the difference between the radial components of distortion for the distortion vectors with origins at the two points of interest. Planar distortion as used herein refers to expansion distortions, rotational distortions, and translational distortions that may occur at a small area or over the entire surface of a substrate. Various approaches discussed below can be used to reduce radial distortion and/or planar distortion for a film stack, such as a stack with alternating oxide and nitride layers.

It has been observed that profiled electrodes can be used to reduce or eliminate radial distortions of a film stack on the substrate 108. In some embodiments, the showerhead 106 and the substrate support 104 have a curvature to adjust the plasma density over the substrate 108. In some embodiments, the showerhead 106 and the substrate support 104 have a curvature that is different from each other. FIGS. 2A and 2B are schematic cross sectional side views of the showerhead 206.

When the center of the substrate 108 is observed to have more tensile stress than the edge of the substrate 108, a convex shaped showerhead and/or a concave substrate support may be used during a substrate process, such as a deposition process of a film stack with alternating oxide and nitride layers, to change a spacing D1 between the showerhead 106 and the substrate support 104. In various embodiments, the spacing D1 may be in a range between about 10 mils to about 30 mils, for example about 15 mils. The spacing D1 between the showerhead 106 and the substrate support 104 may alter the plasma density over the substrate 108, resulting in the center of the substrate 108 being more compressive. For example, the showerhead 206 shown in FIG. 2A may be used to replace the showerhead 106 of FIG. 1. In this embodiment, the showerhead 206 has a first surface 204 facing the substrate support (not shown, such as the substrate support 104 of FIG. 1), and the second surface 208 opposite the first surface 204. The showerhead 206 further comprises a plurality of gas passages 207 formed in the showerhead 206 extending from the first surface 204 to the second surface 208. Unlike a planar first surface 114 shown in FIG. 1, the first surface 204 may have a curvature, such as a convex surface, as shown in FIG. 2A. With the convex first surface 204, the center region of the first surface 204 is closer to the substrate support 104, or the substrates 108, than the edge region of the first surface 204. The convex surface of the showerhead 206 can reduce the spacing D1 at the center region, which in turn increases plasma density at the center region of the substrate 108. As a result, the center of the substrate 108 may become more compressive to balance out the tensile stress originally carried by the substrate 108. Therefore, the IPD/overlay errors of the film stack on the substrate 108 are reduced.

Figure 3A:
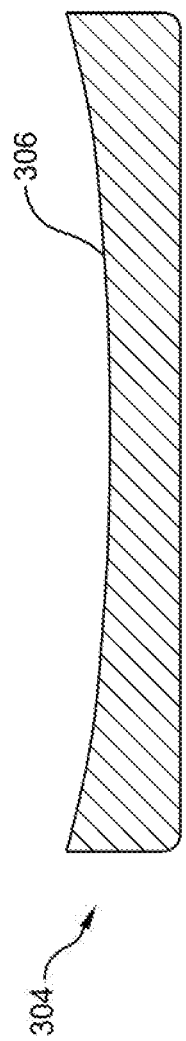
FIGS. 3A-3B are schematic cross-sectional views of a substrate support according to one or more embodiments.

Additionally or alternatively, the substrate support, such as the substrate support 304 shown in FIG. 3A, may have a curvature, such as a concave surface 306, as shown in FIG. 3A. The substrate support 304 may be used to replace the substrate support 104 of FIG. 1. With the concave surface 306, the center region of the concave surface 306 is further away from the showerhead (not shown, such as the showerhead 106 of FIG. 1) than the edge region of the concave surface 306. Therefore, the spacing D1 at the center region is increased to reduce the plasma density at the center region of the substrate 108. The center of the substrate 108 could become more compressive to balance out the tensile stress originally carried by the substrate 108. It is contemplated that the concave surface 306 of the substrate support 304 can work with any of the showerhead 206, 210 of FIGS. 2A and 2B to control the plasma density in order to reduce or minimize the IPD/overlay errors of the film stack on the substrate 108.

When the center of the substrate 108 is observed to have more compressive stress than the edge of the substrate 108, a concave shaped showerhead and/or a convex substrate support may be used during a substrate process, such as a deposition process of a film stack with alternating oxide and nitride layers, to change the spacing D1 between the showerhead 106 and the substrate support 104. The spacing D1 between the showerhead 106 and the substrate support 104 may change the plasma density over the substrate 108, resulting in the center of the substrate 108 less compressive. For example, the showerhead 210 shown in FIG. 2B may be used to replace the showerhead 106 of FIG. 1. In this embodiment, the showerhead 210 includes a first surface 212 facing the substrate support (not shown, such as the substrate support 104 of FIG. 1), and the second surface 214 opposite the first surface 212. The first surface 212 may have a curvature, such as a concave surface, as shown in FIG. 2B. With the concave first surface 212, the center region of the first surface 212 is further away from the substrate support 104, or the substrates 108, than the edge region of the first surface 212. The concave surface of the showerhead 210 can decrease the spacing D1 at the center region, which in turn may lower plasma density at the center region of the substrate 108. As a result, the center of the substrate 108 could become less compressive to balance out the higher compressive stress originally carried by the substrate 108. Therefore, the IPD/overlay errors of the film stack on the substrate 108 are reduced.

Figure 3B:
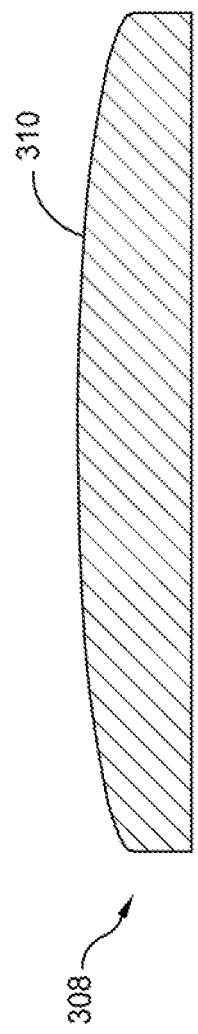

Additionally or alternatively, the substrate support, such as the substrate support 308 shown in FIG. 3B, may have a curvature, such as a convex surface 310, as shown in FIG. 3B. The substrate support 308 may be used to replace the substrate support 104 of FIG. 1. With the convex surface 310, the center region of the concave surface 306 is closer to the showerhead (not shown, such as the showerhead 106 of FIG. 1) than the edge region of the convex surface 310. Therefore, the spacing D1 at the center region is decreased to reduce the plasma density at the center region of the substrate 108. The center of the substrate 108 could become less compressive to balance out the higher compressive stress originally carried by the substrate 108. It is contemplated that the convex surface 310 of the substrate support 308 can work with any of the showerhead 206, 210 of FIGS. 2A and 2B to control the plasma density in order to reduce or minimize the IPD/overlay errors of the film stack on the substrate 108.

In some embodiments, which can include or combine with any of other embodiments described in this disclosure, the substrate support 104 may include two or more electrodes for tuning the plasma density radially over the substrate 108 during a substrate process, such as a deposition process of a film stack with alternating oxide and nitride layers. For example, in the embodiment shown in FIG. 1, a first electrode 120 may be embedded within the substrate support 104 or coupled to a surface of the substrate support 104. The first electrode 120 may be a plate, a perforated plate, a mesh, a wire screen, or any other distributed arrangement of conductive elements. A second electrode 122 may also be embedded within the substrate support 104 or coupled to a surface of the substrate support 104. Likewise, the second electrode 122 may be a plate, a perforated plate, a mesh, a wire screen, or any other distributed arrangement of conductive elements. In one embodiment, both the first and second electrodes 120, 122 are a mesh. The first electrode 120 may expand across the substrate support 104 at a first height. The first electrode 120 may have a length equal to the diameter of the substrate 108. The second electrode 122 may be disposed at the edge region of the substrate support 104 at a second height that is different from the first height. In one embodiment which may be combined with other embodiments, the second height is higher than the first height. In one embodiment which may be combined with other embodiments, the second height is lower than the first height. The second electrode 122 is disposed radially outward of the first electrode 120, and may or may not overlap with a portion of the first electrode 120.

The first electrode 120 is coupled to a power source 124 by a conduct 126, for example a cable disposed in the shaft 128 of the substrate support 104. A first controller 130, such as an impedance matching circuit, may be disposed between the power source 124 and the first electrode 120 to independently control the impedance of the first electrode 120 at an inner zone of the substrate support 104. The power source 124 may be DC power, pulsed DC power, RF bias power, pulsed RF source or bias power, or a combination thereof. The second electrode 122 is coupled to a power source 132 by a conduct 134, for example a cable disposed in the shaft 128 of the substrate support 104. A second controller 136, such as an impedance matching circuit, may be disposed between the power source 132 and the second electrode 122 to independently control the impedance of the second electrode 122 at the outer zone of the substrate support 104. The outer zone surrounds the inner zone and may have a radial distance covering an area from the edge of the substrate to the edge of the substrate support 104. The inner zone may have a radial distance at least equal to the diameter of the substrate. The power source 132 may be DC power, pulsed DC power, RF bias power, pulsed RF source or bias power, or a combination thereof. The first electrode 120 and the second electrode 122 can thus independently control the impedance.

When the center of the substrate 108 is observed to have more compressive stress than the edge of the substrate 108, the second controller 136 can be configured so that the impedance of the second electrode 122 at the outer zone is lower than the impedance at the inner zone during the substrate process, such as a deposition process of a film stack with alternating oxide and nitride layers. Alternatively, the first controller 130 can be configured to have higher impedance at the inner zone than the impedance at the outer zone. In either case, the lower impedance at the outer zone of the substrate support 104 can cause more plasma to couple to the outer zone, resulting in the substrate 108 with higher compressive stress at the edge area. Therefore, the stress uniformity across the substrate 108 is achieved, thereby reducing or eliminating radial distortions of the film stack on the substrate 108.

Likewise, when the center of the substrate 108 is observed to have less compressive stress than the edge of the substrate 108, the second controller 136 can be configured so that the impedance of the second electrode 122 at the outer zone is higher than the impedance at the inner zone during the substrate process, such as a deposition process of a film stack with alternating oxide and nitride layers. Alternatively, the first controller 130 can be configured to have lower impedance at the inner zone than the impedance at the outer zone. In either case, the higher impedance at the outer zone of the substrate support 104 can cause less plasma to couple to the outer zone, resulting in the substrate 108 with less compressive stress at the edge area. Therefore, the stress uniformity across the substrate 108 is achieved, thereby reducing or eliminating radial distortions of the film stack on the substrate 108.

In some embodiments, which can include or combine with any of other embodiments described in this disclosure, the apertures 146 of the blocking plate 140 may be configured for tuning the deposition rate during a substrate process, such as a deposition process of a film stack with alternating oxide and nitride layers. When the center of the substrate 108 is observed to have more compressive stress than the edge of the substrate 108, the blocking plate 140 can have more apertures 146 at the center region than the apertures at the edge region of the blocking plate 140, as shown in FIG. 1. For example, the apertures 146 at the center region may have a first density and the apertures 146 at the edge region may have a second density, and a ratio of the first density to the second density can be about 1.2:1 to about 5:1, for example about 1.5:1 to about 3:1.

The density of apertures 146 can be calculated by dividing the total area defined by the openings of the apertures 146 at the first surface 148 (facing the substrate support 104) by the total area of the first surface 148 of the blocking plate 140 in the measured region. The density of the apertures 146 at the center region of the blocking plate 140 can range from about 10% to about 100%, for example from about 60% to about 100%. The density of the apertures 146 is higher in the center region than the edge region in order to increase the gas flow in the center region. The density changes from the center region to the edge region should be gradual and smooth to ensure uniform and smooth deposition and film property profiles. Higher density of apertures 146 at the center of the blocking plate 140 can increase the gas flow in the center region of the gas mixing volume 142, and thus increase gas flow and plasma density in the center region of the reaction volume 144. Therefore, the film stack will have higher deposition rate at the center region of the substrate 108. By having the higher deposition rate at the center region of the substrate 108, the center of the substrate 108 may become less compressive than that of the edge of the substrate 108. As a result, the IPD (e.g., radial distortion) and overlay errors of the film stack on the substrate 108 are reduced or minimized.

When the center of the substrate 108 is observed to have less compressive stress than the edge of the substrate 108, the blocking plate 140 can have less number of apertures 146 at the center region than the apertures at the edge region of the blocking plate 140. For example, the apertures 146 at the center region may have a first density and the apertures 146 at the edge region may have a second density, and a ratio of the first density to the second density can be about 1:1.2 to about 1:5, for example about 1:1.5 to about 1:3.

In this embodiment, the density of the apertures 146 at the center region of the blocking plate 140 can range from about 10% to about 100%, for example about 10% to about 40%. The density of the apertures 146 is lower in the center region than the edge region, decreasing gas flow in the center region. The density changes from the center region to the edge region should be gradual and smooth to ensure uniform and smooth deposition and film property profiles. Lower density of apertures 146 at the center of the blocking plate 140 can decrease the gas flow in the center region of the gas mixing volume 142, and thus lower gas flow and plasma density in the center region of the reaction volume 144. Therefore, the film stack will have lower deposition rate at the center region of the substrate 108. By having the lower deposition rate at the center region of the substrate 108, the center of the substrate 108 could become more compressive than that of the edge of the substrate 108. As a result, the IPD (e.g., radial distortion)/overlay errors of the film stack on the substrate 108 is reduced or minimized.

The design concept of the density of the apertures 146 may also be applied to the gas passage 115 designs to improve center to edge uniformity.

In various embodiments, a matching network 154 may be disposed over the top of the process chamber 100. The matching network 154 may be electrically connected to a radio frequency (RF) source 158 by a transmission line 156. RF power may be generated by the RF source 158 and applied to the showerhead 106 by a RF feed 160. The RF feed 160 may have a first end 162 electrically coupled to the matching network 154 and a second end 164 electrically coupled to the showerhead 106. The RF feed 160 may be made of a flexible electrically conductive material, such as a copper strip. As will be discussed in more detail below, the second end 164 of the RF feed 160 may be coupled to different locations on the showerhead 106 in order to reduce plasma non-uniformity.

Figure 4:
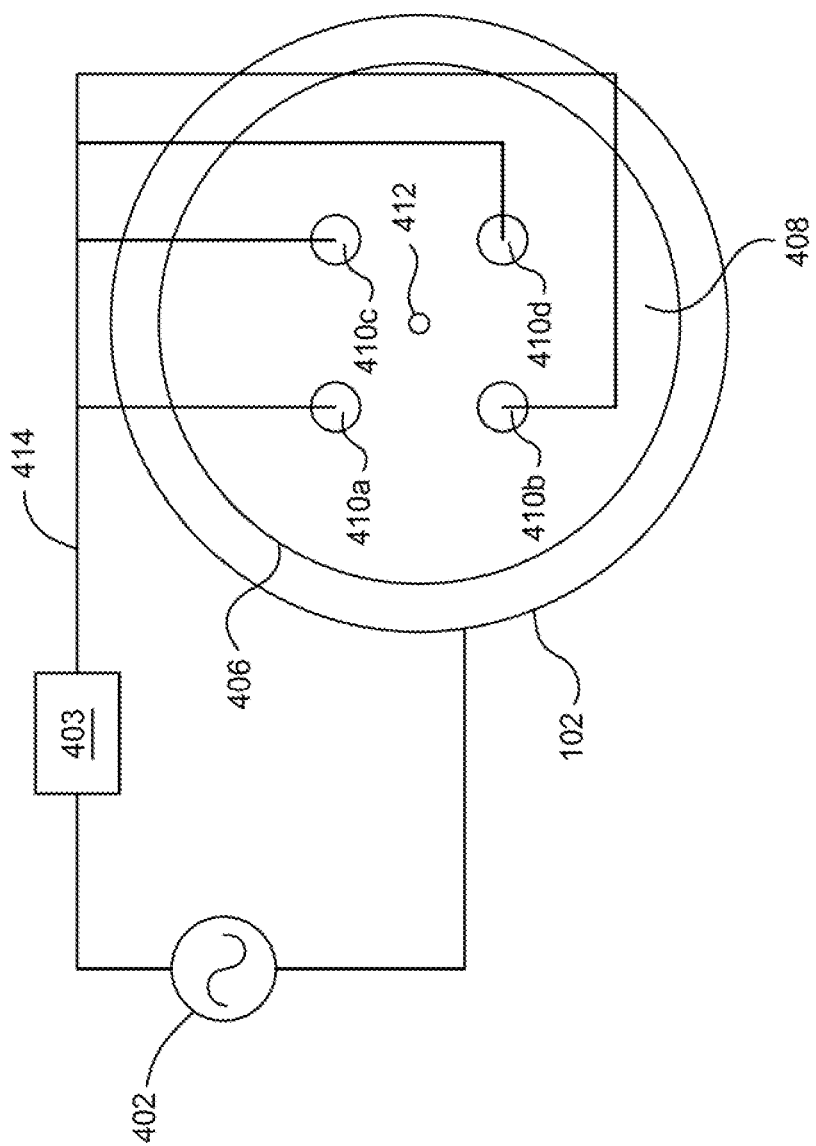
FIG. 4 is a schematic top view of a showerhead according to one embodiment.

FIG. 4 is a schematic top view of a showerhead 406 according to one embodiment. The showerhead 406 may be used in place of the showerhead 106 of FIG. 1. As shown in FIG. 4, the showerhead 406 may be circular and have a top surface 408 facing away from the substrate support 104 (FIG. 1). A plurality of coupling points 410a, 410b, 410c, 410d may be located on the top surface 408 of the showerhead 406. Each coupling point 410a-410d may be utilized to secure the second end (e.g., second end 164) of the RF feed 160 as shown in FIG. 1. The coupling points 410a-410d are disposed at locations of the showerhead 406 that are symmetrical about a center point 412 of the showerhead 406. The RF power source 402 is electrically coupled thereto at multiple locations via transmission lines (collectively labeled as 414) during a substrate process, such as a deposition process of a film stack with alternating oxide and nitride layers. A matching network 403 (e.g., matching network 154) may be disposed between the RF power source 402 and the coupling points 410a-410d. The coupling points 410a-410d are arranged in a symmetric fashion to improve the plasma uniformity over the substrate 108 (FIG. 1). As a result, IPD residual uniformity is reduced.

While four coupling points 410a-410d are shown in FIG. 4, more or less coupling points are contemplated. In one embodiment, six coupling points are utilized. In another embodiment, eight coupling points are utilized. In yet another embodiment, a single coupling point is utilized and may be disposed at the center of the showerhead 406. When multiple coupling points are used, the coupling points may be arranged symmetrically at the showerhead 106 to reduce or eliminate planar and/or residual distortions of the film stack on the substrate 108. It is contemplated that the concept described herein can also be applied to the substrate support if the RF power is coupled thereto. In such a case, one or more RF feeds can be coupled to multiple locations of the electrodes (e.g., first and/or second electrodes 120, 122 shown in FIG. 1) of the substrate support 104.

Other approaches may also be used to help reduce or eliminate planar and/or residual distortions of the film stack on the substrate 108 during a substrate process. For example, adjusting devices 170, 172 may be attached to a bottom of the substrate support 104, as shown in FIG. 1. The adjusting devices 170, 172 may be disposed in a symmetric fashion with respect to a central axis (not shown) passing through a longitudinal direction of the shaft 128. The adjusting devices 170, 172 may extend though a bottom of the process chamber 100 and rotate during, before, or after a substrate process to adjust the leveling of the substrate support 104. The adjusting devices 170, 172 may be any device or mechanism that is suitable for adjusting the height of the substrate support 104. The leveling of the substrate support 104 can be changed to tune side-to-side or front-to-back plasma density over the substrate 108. As a result, a uniform side-to-side stress profile of the film stack is obtained.

In some embodiments, which can include or be combined with any other embodiments of this disclosure, the planar distortions of the film stack can be reduced or eliminated by rotating the substrate support 104 during a substrate process, such as a deposition process of a film stack with alternating oxide and nitride layers. The rotation of the substrate support 104 may be a continuous rotation in one direction, or oscillating in opposite directions, such as changing rotation direction after rotating 180 degrees. In one embodiment, the deposition of the film stack is split into two deposition processes with the substrate 108 rotating 180 degrees to eliminate the IPD planar distortions. For example, the film stack may include a total of about 2 to 90 pairs of oxide layers and nitride layers, and the first half of the film stack (e.g., 1 to 45 pairs of oxide layers and nitride layers) may be deposited with the substrate support 104 held stationary and the second half of the film stack (e.g., 46 to 90 pairs of oxide layers and nitride layers) may be deposited with the substrate support 104 rotated 180 degrees, thereby compensating for the difference in the film deposition profile caused by the IPD distortions. As a result, the thickness uniformity of the deposited film stack is improved.

It is contemplated that the concept described herein can be equally applied to multiple deposition processes. For example, the deposition of the film stack can be split into three deposition processes with the substrate 108 rotating 120 degrees. Alternatively, the deposition of the film stack can be split into four depositions with the substrate 108 rotating 90 degrees, and so on.

Due to the large area of the showerhead 106 or electrode, the RF voltage applied thereto may have an interference wave pattern that distorts the plasma. An example for wave interference pattern is a standing wave. The standing wave may occur at or near the center of the electrode, such as the showerhead 106. Since the plasma is not uniformly distributed due to the standing wave effect or interference wave pattern, the film stack deposited on the substrate 108 may not have a uniform thickness across the substrate 108. As a result, the film stress uniformity is compromised.

To improve the plasma uniformity, the RF power can be applied to the electrode, such as the showerhead 106, at a low RF frequency during a substrate process, such as a deposition process of a film stack with alternating oxide and nitride layers. The low RF frequency may be in a range from about 0.3 MHz to about 60 MHz, for example about 13.56 MHz to about 40 MHz. In one embodiment, the low RF frequency is about 14 MHz to about 27 MHz. The use of lower RF frequency can result in the RF power transmitting at a shorter wavelength. For example, the RF frequency of 13.56 MHz corresponds to a wavelength of 22 meters, and the RF frequency of 27 MHz corresponds to a wavelength of 11 meters. The RF power delivered with shorter wavelengths is found to be comparable with, or in the same order as the showerhead 106. As a result, the standing wave effect or interference wave pattern occurring at or near the center of the showerhead 106 can be mitigated.

The RF power with low RF frequency can be applied to the electrode through multiple coupling points, such as coupling points 410a-410d disposed on the showerhead 106 as discussed above. Additionally or alternatively, the RF power with low RF frequency can be applied to the electrodes of the substrate support 104, e.g., first and/or second electrodes 120, 122 shown in FIG. 1.

It is contemplated that the approach of applying low RF frequency to the electrodes can be combined with any of the embodiments discussed in this disclosure. For example, in some embodiments, the low RF frequency may be used in conjunction with the convex or concave showerhead 106 and/or convex or concave substrate support 104 to keep the spacing D1 (FIG. 1) at 15 mils. In one embodiment, the low RF frequency can be used in conjunction with multiple RF feed locations and the convex or concave showerhead 106 and/or convex or concave substrate support 104 to keep the spacing D1 at 15 mils. In some embodiments low RF frequency can be used in conjunction with multiple RF feed locations, different density of apertures at the center region of the blocking plate, and the convex or concave showerhead 106 and/or convex or concave substrate support 104 to keep the spacing D1 within a predetermined ranges or at a predetermined value, so as at 15 mils.

Figure 5:
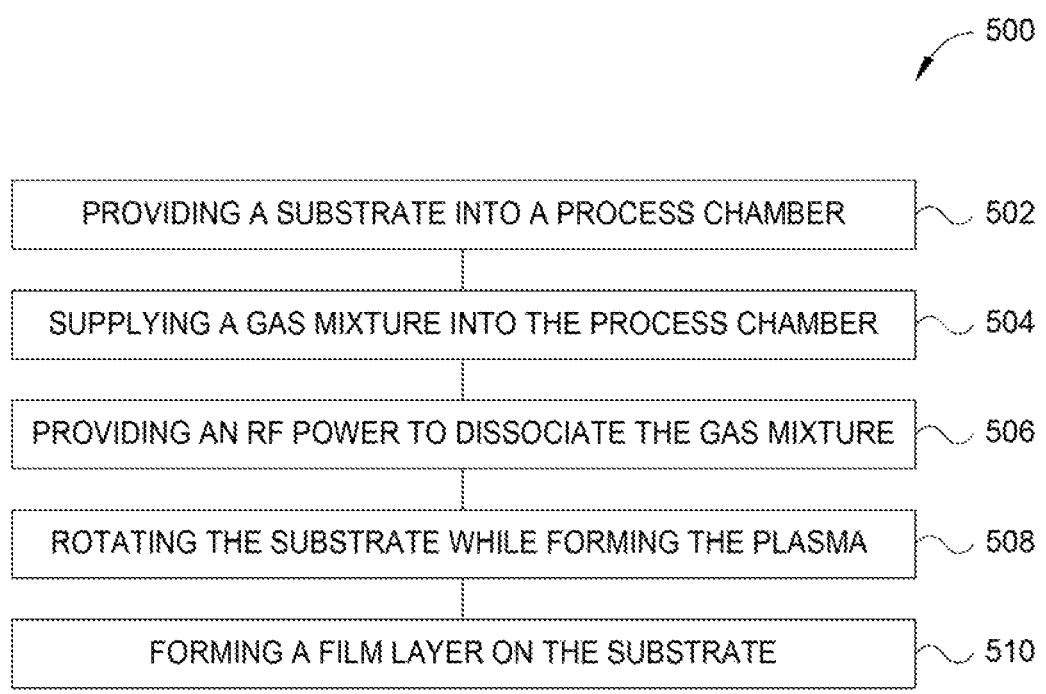
FIG. 5 illustrate a method for forming a film layer according to one or more embodiments.

Various embodiments can be combined in any order to perform a substrate process, such as a deposition process of a film stack with alternating oxide and nitride layers. FIG. 5 illustrate a method 500 for forming a film layer, such as a dielectric layer, which may be later utilized to form a gate structure for semiconductor devices. In one example, the film layer may be utilized to form gate structures for three dimensional (3D) NAND semiconductor applications. In manufacturing three dimensional (3D) NAND semiconductor applications, stair-like oxide-nitride pairs of structures are often utilized to high aspect ratio gate stack NAND cells so as to increase circuit density.

Figure 6A:
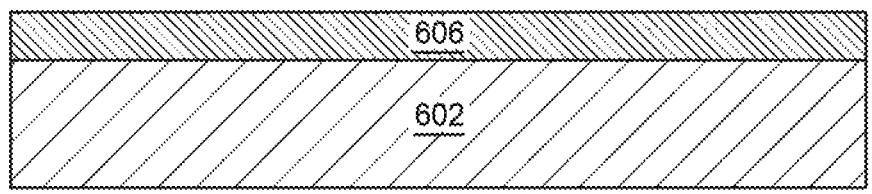
FIGS. 6A-6B are cross-sectional views of a film layer on a substrate in accordance with the method of FIG. 5.

The sequence described in FIG. 5 corresponds to the fabrication stages depicted in FIGS. 6A-6B, which are discussed below. The method 500 begins at operation 502 by providing a substrate 602 into a deposition process chamber, such as the process chamber 100 shown in FIG. 1. The substrate 602 has a first film layer 606 formed thereon. The first film layer 606 may be a silicon oxide containing layer, a silicon nitride containing layer, a silicon containing layer, such as amorphous silicon, polycrystalline silicon or any suitable crystalline silicon layers. In the example depicted in FIG. 6A, the first film layer 606 is a silicon oxide containing layer, such as a silicon oxide layer. The substrate 602 may be material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire.

Figure 6B:
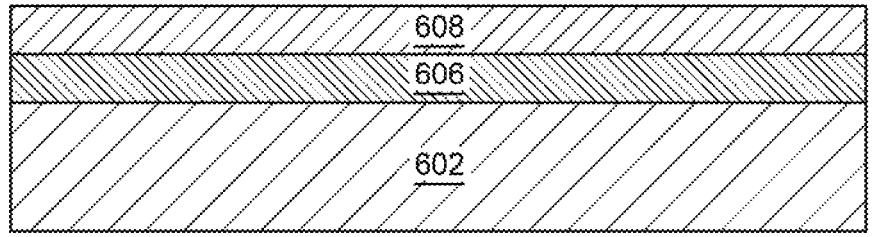

At operation 504, a deposition gas mixture is provided into the process chamber to form a second film layer 608, such as a silicon nitride containing layer, on the first film layer 606, as shown in FIG. 6B. The deposition gas mixture may include a silicon containing gas and a reacting gas. Suitable silicon containing gas may include, but is not limited to, silane ($SiH_4$), di-silane($Si_2H_6$), silicon tetrafluoride ($SiF_4$), silicon tetrachloride($SiCl_4$), dichlorsilane ($SiH_2Cl_2$), tetraethyl orthosilicate (TEOS), and the like. The reacting gas may be an oxygen containing gas for forming a silicon oxide containing layer, a nitrogen containing gas for forming a silicon nitride containing layer, or a carbon containing gas for forming a silicon carbide containing layer. Suitable examples of the oxygen containing gas include $O_2$, $N_2O$, $NO_2$, $O_3$, $H_2O$ and the like. Suitable examples of the nitrogen containing gas include $N_2$, $N_2O$, $NO_2$, $NH_3$, $N_2H_2$ and the like. Suitable examples of the carbon containing gas include $CO_2$, CO, $CH_4$, $CF_4$, other suitable carbon based polymer gases and the like. One or more inert gases may be included in the deposition gas mixture. The inert gas may include, but is not limited to, noble gas, such as Ar, He, and Xe, or $N_2$ and the like. The chamber pressure may be maintained in a range between about 10 mTorr and about 15 Torr, and the substrate temperature may be maintained in a range between about 200 degrees Celsius and about 700 degrees Celsius. Depending on the stress profile of the substrate, the showerhead and/or the substrate support of the process chamber may have a curvature to obtain a pre-determined spacing between the showerhead and the substrate support, such as about 10 mils to about 30 mils as discussed above with respect to FIGS. 1, 2A, 2B, 3A, and 3B.

At operation 506, an RF power is generated by a power source, such as a radio frequency (RF) source 158 (FIG. 1), and coupled to the deposition gas mixture to assist dissociation of the deposition gas mixture into reactive species in a plasma. The RF power may be operated at a low RF frequency ranging from about 13.56 MHz to about 40 MHz, for example about 27 MHz as discussed above. The RF power may be operated at about 10 Watts to about 5000 Watts, such as about 500 Watts. An RF bias power may be provided by one or more power sources, such as the power source 124, 132 in a manner as discussed above to improve the plasma density during the deposition process. The RF bias power may be supplied at between about 10 Watts and about 100 Watts at a frequency of 300 kHz. In one embodiment, the RF bias power may be pulsed with a duty cycle between about 10 to about 95 percent at a RF frequency between about 500 Hz and about 10 kHz. Unless otherwise noted, the process parameters discussed in this disclosure are based on substrates with one of a 200 mm diameter, a 300 mm diameter, or a 450 mm diameter.

At operation 508, while forming the plasma from the deposition gas mixture, the substrate support, such as the substrate support 104 (FIG. 1) may be rotated in a continuous manner, or oscillating in opposite directions, such as changing rotation direction after rotating 180 degrees to assist the substrate exposing to the plasma in a more uniform manner. The substrate support 104 may rotate between about 1° and about 360°, such as between about 30° and about 270°, for example, between about 90° and about 180°, depending on the number of splits as discussed above. The substrate support may continue to rotate the substrate throughout the deposition process.

At operation 510, the second film layer 608 is deposited to a desired thickness. After deposition to a desired thickness, the deposition process is then terminated. In one example, the second film layer 608 may have a thickness between about 10 nm and about 60 nm, such as about 30 nm. In embodiments wherein the second film layer 608 is a silicon nitride layer, the silicon nitride layer may have a stress range between about −200 MPa and about +1200 MPa with a stress uniformity less than 50%. The second film layer 608 may have a local bow range less than 50 µm. It is noted that the stress uniformity (U %) as discussed herein refers to a variation ($\Delta$) of the absolute stress values measured across the substrate surface (e.g., variation between the largest stress value and the smallest stress value obtained from either 9 points, 49 points, or 69 points of stress measurement) divided by an average ($\sigma$) of the stress (e.g., an average from stress values obtained from 9 point, 49 points, or 69 points stress measurement) measured from the film layer (such as $\sigma/\Delta=U$ %).

Figure 7:
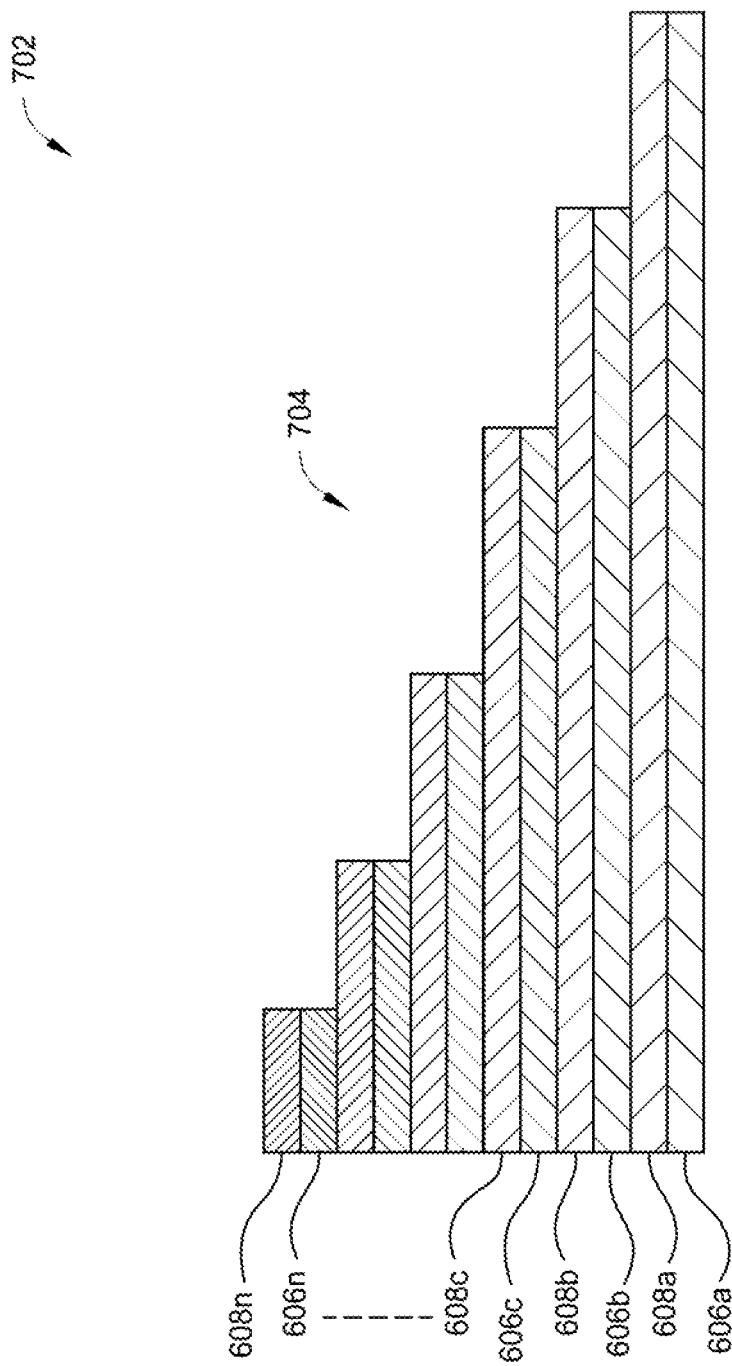
FIG. 7 is a cross-sectional view of a stair-like structure according to one or more embodiments.

The deposition processes for forming the first film layer 606 and the second film layer 608 may be performed repeatedly to form a film stack 702, which may be later patterned to form stair-like structures for 3D NAND semiconductor devices. FIG. 7 illustrates a cross sectional view of a stair-like structure 704 according to one or more embodiments. In the example shown in FIG. 7, the film stack 702 may include alternating layers of first film layer 606 and the second film layer 608 discussed above (shown as 606a, 608a, 606b, 608b, . . . , 606n, 608n). The film stack 702 may have a total thickness between about 600 nm and about 4000 nm. The film stack 702 may include a total of about 5 to 90 pairs of first film layer 606 and the second film layer 608. In the subsequently patterning or etching process, a photoresist layer may be used to sequentially trim to different dimensions while serving as an etch mask for the stair-like structure 704 to complete gate structures for the 3D NAND semiconductor devices.

While the foregoing is directed to embodiments of the present disclosure, other and further embodiments of the disclosure may be devised without departing from the basic scope thereof, and the scope thereof is determined by the claims that follow.

The invention claimed is:

1. A method for forming a film layer on a substrate, comprising:
    positioning a substrate on a substrate support in a process chamber;
    flowing a deposition gas mixture comprising a silicon containing gas and a reacting gas to the process chamber through a showerhead having a convex surface facing the substrate support or a concave surface facing the substrate support in accordance with a compressive or tensile stress profile of the substrate;
    forming a plasma in the presence of the deposition gas mixture in the process chamber by applying an RF power to multiple coupling points of the showerhead that are symmetrically arranged about a center point of the showerhead;
    performing a deposition process while rotating the substrate to deposit a film layer on the substrate; and
    delivering the deposition gas mixture through a blocking plate disposed above the showerhead by:
        flowing the deposition gas mixture through apertures at a center region of the blocking plate with a first density and apertures at an edge region of the blocking plate with a second density lower than the first density, if the center region of the substrate has a higher compressive stress than a compressive stress at the edge region of the substrate; or
        flowing the deposition gas mixture through apertures at the center region of the blocking plate with a third density and apertures at the edge region of the blocking plate with a fourth density higher than the third density, if the center region of the substrate has a less compressive stress than a compressive stress at the edge region of the substrate.

2. The method of claim 1, wherein the silicon containing gas includes at least one of silane, di-silane, silicon tetrafluoride, silicon tetrachloride, dichlorsilane, and tetraethyl orthosilicate; and wherein the reacting gas comprises at least one of an oxygen containing gas, a nitrogen containing gas, and a carbon containing gas.

3. The method of claim 1, further comprising:
    tuning side-to-side or front-to-back plasma density over the substrate by adjusting a height of the substrate support during the deposition process.

4. The method of claim 1, wherein the film layer is a film stack comprising a first film layer and a second film layer disposed on the first film layer, the first film layer and the second film layer are alternatively and repeatedly formed in the film stack, and the film stack has a local bow range less than 200 µm.

5. The method of claim 4, wherein the first film layer is a silicon oxide layer, and the second film layer is a silicon nitride layer.

6. A method for forming a film layer on a substrate, comprising:
positioning a substrate on a substrate support in a process chamber;
flowing a deposition gas mixture comprising a silicon containing gas and a reacting gas to the process chamber through a showerhead having a convex surface facing the substrate support or a concave surface facing the substrate support in accordance with a compressive or tensile stress profile of the substrate;
forming a plasma in the presence of the deposition gas mixture in the process chamber by applying an RF power to multiple coupling points of the showerhead that are symmetrically arranged about a center point of the showerhead;
performing a deposition process while rotating the substrate to deposit a film layer on the substrate; and
tuning plasma density over the substrate by:
maintaining a first electrode at an outer zone of the substrate support at a first impedance and a second electrode at an inner zone of the substrate at a second impedance higher than the first impedance, if the center region of the substrate has a higher compressive stress than a compressive stress at an edge region of the substrate; or
maintaining the first electrode at the outer zone of the substrate support at a third impedance and the second electrode at the inner zone of the substrate at a fourth impedance lower than the third impedance, if the center region of the substrate has a less compressive stress than a compressive stress at the edge region of the substrate.

7. A method for forming a film layer on a substrate, comprising:
positioning a substrate on a substrate support in a process chamber, the substrate support having a concave substrate supporting surface or a convex substrate supporting surface in accordance with a compressive or tensile stress profile of the substrate;
flowing a deposition gas mixture comprising a silicon containing gas and a reacting gas to a process chamber through a showerhead;
forming a plasma in the presence of the deposition gas mixture in the process chamber by applying an RF power to multiple coupling points of the showerhead that are symmetrically arranged about a center point of the showerhead;
performing a deposition process while rotating the substrate to deposit a film layer on the substrate; and
delivering the deposition gas mixture through a blocking plate disposed above the showerhead by:
flowing the deposition gas mixture through apertures at a center region of the blocking plate with a first density and apertures at an edge region of the blocking plate with a second density lower than the first density, if the center region of the substrate has a higher compressive stress than a compressive stress at the edge region of the substrate; or
flowing the deposition gas mixture through apertures at the center region of the blocking plate with a third density and apertures at the edge region of the blocking plate with a fourth density higher than the third density, if the center region of the substrate has a less compressive stress than a compressive stress at the edge region of the substrate.

8. The method of claim 7, wherein the silicon containing gas includes at least one of silane, di-silane, silicon tetrafluoride, silicon tetrachloride, dichlorsilane, and tetraethyl orthosilicate; and wherein the reacting gas comprises at least one of an oxygen containing gas, a nitrogen containing gas, and a carbon containing gas.

9. The method of claim 7, further comprising:
tuning side-to-side or front-to-back plasma density over the substrate by adjusting a height of the substrate support during the deposition process.

10. The method of claim 7, wherein the film layer is a film stack comprising a first film layer and a second film layer disposed on the first film layer, the first film layer and the second film layer are alternatively and repeatedly formed in the film stack, and the film stack has a local bow range less than 200 μm.

11. The method of claim 10, wherein the first film layer is a silicon oxide layer, and the second film layer is a silicon nitride layer.

12. A method for forming a film layer on a substrate, comprising:
positioning a substrate on a substrate support in a process chamber, the substrate support having a concave substrate supporting surface or a convex substrate supporting surface in accordance with a compressive or tensile stress profile of the substrate;
flowing a deposition gas mixture comprising a silicon containing gas and a reacting pas to a process chamber through a showerhead;
forming a plasma in the presence of the deposition gas mixture in the process chamber by applying an RF power to multiple coupling points of the showerhead that are symmetrically arranged about a center point of the showerhead;
performing a deposition process while rotating the substrate to deposit a film layer on the substrate; and
tuning plasma density over the substrate by:
maintaining a first electrode at an outer zone of the substrate support at a first impedance and a second electrode at an inner zone of the substrate at a second impedance higher than the first impedance, if the center region of the substrate has a higher compressive stress than a compressive stress at an edge region of the substrate; or
maintaining the first electrode at the outer zone of the substrate support at a third impedance and the second electrode at the inner zone of the substrate at a fourth impedance lower than the third impedance, if the center region of the substrate has a less compressive stress than a compressive stress at the edge region of the substrate.

13. A method for forming a film layer on a substrate, comprising:
positioning a substrate on a substrate support in a process chamber, the substrate support having a concave substrate supporting surface or a convex substrate supporting surface in accordance with a compressive or tensile stress profile of the substrate;
flowing a deposition gas mixture comprising a silicon containing gas and a reacting gas to a process chamber through a showerhead having a convex surface facing the substrate support or a concave surface facing the substrate support in accordance with a compressive or tensile stress profile of the substrate;

forming a plasma in the presence of the deposition gas mixture in the process chamber by applying an RF power to multiple coupling points of the showerhead that are symmetrically arranged about a center point of the showerhead;

performing a deposition process while rotating the substrate to deposit a film layer on the substrate and tuning side-to-side or front-to-back plasma density over the substrate by adjusting a height of the substrate support; and delivering the deposition gas mixture through a blocking plate disposed above the showerhead by:

flowing the deposition gas mixture through apertures at a center region of the blocking plate with a first density and apertures at an edge region of the blocking plate with a second density lower than the first density, if the center region of the substrate has a higher compressive stress than a compressive stress at the edge region of the substrate; or flowing the deposition gas mixture through apertures at the center region of the blocking plate with a third density and apertures at the edge region of the blocking plate with a fourth density higher than the third density, if the center region of the substrate has a less compressive stress than a compressive stress at the edge region of the substrate.

14. The method of claim 13, wherein the silicon containing gas includes at least one of silane, di-silane, silicon tetrafluoride, silicon tetrachloride, dichlorsilane, and tetra-ethyl orthosilicate; and wherein the reacting gas comprises at least one of an oxygen containing gas, a nitrogen containing gas, and a carbon containing gas.

15. The method of claim 13, wherein the film layer is a film stack comprising a first film layer and a second film layer disposed on the first film layer, the first film layer and the second film layer are alternatively and repeatedly formed in the film stack, and the film stack has a local bow range less than 200 μm.

16. The method of claim 15, wherein the first film layer is a silicon oxide layer, and the second film layer is a silicon nitride layer.

17. A method for forming a film layer on a substrate, comprising:

positioning a substrate on a substrate support in a process chamber, the substrate support having a concave substrate supporting surface or a convex substrate supporting surface in accordance with a compressive or tensile stress profile of the substrate;

flowing a deposition gas mixture comprising a silicon containing gas and a reacting pas to a process chamber through a showerhead having a convex surface facing the substrate support or a concave surface facing the substrate support in accordance with a compressive or tensile stress profile of the substrate;

forming a plasma in the presence of the deposition gas mixture in the process chamber by applying an RF power to multiple coupling points of the showerhead that are symmetrically arranged about a center point of the showerhead; and performing a deposition process while rotating the substrate to deposit a film layer on the substrate and tuning side-to-side or front-to-back plasma density over the substrate by adjusting a height of the substrate support, and wherein the tuning the side-to-side or front-to-back plasma density over the substrate comprises:

maintaining a first electrode at an outer zone of the substrate support at a first impedance and a second electrode at an inner zone of the substrate at a second impedance higher than the first impedance, if the center region of the substrate has a higher compressive stress than a compressive stress at an edge region of the substrate; or maintaining the first electrode at the outer zone of the substrate support at a third impedance and the second electrode at the inner zone of the substrate at a fourth impedance lower than the third impedance, if the center region of the substrate has a less compressive stress than a compressive stress at the edge region of the substrate.

* * * * *